United States Patent
Ayres et al.

(10) Patent No.: US 11,573,260 B2
(45) Date of Patent: Feb. 7, 2023

(54) ELECTRONIC DEVICE COMPRISING WIRE LINKS

(71) Applicant: STMicroelectronics (Crolles 2) SAS, Crolles (FR)

(72) Inventors: Alexandre Ayres, Grenoble (FR); Bertrand Borot, Le Cheylas (FR)

(73) Assignee: STMicroelectronics (Grolles 2) SAS, Crolles (FR)

(*) Notice: Subject to any disclaimer, the term of this patent is extended or adjusted under 35 U.S.C. 154(b) by 0 days.

(21) Appl. No.: 17/543,337

(22) Filed: Dec. 6, 2021

(65) Prior Publication Data

US 2022/0178989 A1   Jun. 9, 2022

(30) Foreign Application Priority Data

Dec. 9, 2020 (FR) .................................. 2012889

(51) Int. Cl.
*G01R 31/28* (2006.01)
(52) U.S. Cl.
CPC ..... *G01R 31/2853* (2013.01); *G01R 31/2884* (2013.01)
(58) Field of Classification Search
CPC ............ G01R 31/2853; G01R 31/2884; G01R 31/70; G01R 31/54; H01L 22/14; H01L 23/49816; H01L 23/525; H01L 24/85; H01L 23/60; H01L 24/05; H01L 24/13; H01L 24/16; H01L 24/32; H01L 24/48; H01L 24/49; H01L 24/73; H01L 24/81; H01L 2224/05554; H01L 2224/06135; H01L 2224/06138; H01L 2224/13101; H01L 2224/16225; H01L 2224/32225; H01L 24/06; H01L 2224/48091; H01L 2224/48227; H01L 2224/49171; H01L 2224/73257; H01L 2224/73265; H01L 2224/81801; H01L 2224/859;

(Continued)

(56) References Cited

U.S. PATENT DOCUMENTS

| 8,791,582 B2* | 7/2014 | Lee .................. H01L 23/62 257/782 |
| 9,698,124 B2* | 7/2017 | Tremlett .............. H01L 25/50 |
| 2012/0032684 A1 | 2/2012 | Siddiquie et al. |

(Continued)

FOREIGN PATENT DOCUMENTS

DE   102006049324 A1   4/2008

OTHER PUBLICATIONS

INPI Search Report and Written Opinion for priority application, FR 2012889, dated Aug. 11, 2021, 11 pages.

*Primary Examiner* — Giovanni Astacio-Oquendo
(74) *Attorney, Agent, or Firm* — Crowe & Dunlevy

(57) ABSTRACT

An integrated circuit chip is attached to a support that includes first conductive elements. First conductive pads are located on the integrated circuit chip and are electrically coupled to the first conductive elements by conductive wires. The integrated circuit chip further includes a conductive track. A switch circuit is provided to selectively electrically connect each first conductive pad to the conductive track. To test the conductive wires, a group of first conductive pads are connected by their respective switch circuits to the conductive track and current flow between corresponding first conductive elements is measured.

18 Claims, 3 Drawing Sheets

(58) Field of Classification Search
CPC ........... H01L 2924/00014; H01L 2924/10162; H01L 2924/15311; H01L 2924/181
USPC ..................................... 324/750.3, 537, 500
See application file for complete search history.

(56) References Cited

U.S. PATENT DOCUMENTS

2016/0231373 A1    8/2016  Kajiyama et al.
2017/0133356 A1*  5/2017  Mercier .................. H01L 33/24

* cited by examiner

ELECTRONIC DEVICE COMPRISING WIRE LINKS

PRIORITY CLAIM

This application claims the priority benefit of French Application for Patent No. 2012889, filed on Dec. 9, 2020, the content of which is hereby incorporated by reference in its entirety to the maximum extent allowable by law.

TECHNICAL FIELD

The present disclosure generally relates to electronic devices and, more particularly, to devices comprising wire links as well as methods of testing these wire links.

BACKGROUND

It is known to form electronic devices comprising a chip attached to a support and coupled to other devices via this support, the chip being generally covered with a protection layer. The link between the chip and the support is often formed by wire links, that is, by electric wires, or cables.

Wire links are generally tested by means of X rays, enabling to observe the cables. Such tests however do not enable to electrically test the cables.

There is a need in the art to address the disadvantages of known devices comprising wire links.

SUMMARY

An embodiment provides a device comprising a chip attached to a support; first conductive elements located on a first surface of the support; first conductive pads located on the chip, the conductive pads being coupled to the first conductive elements by conductive wires; and a conductive track located on the chip, coupled to each conductive pad by a switch circuit.

According to an embodiment, the chip is covered with a protection layer, covering the first elements and the wires.

According to an embodiment, the device comprises second conductive elements located on a second surface of the support.

According to an embodiment, the device comprises second conductive pads coupled to first conductive elements by conductive wires.

According to an embodiment, the second pads are configured to supply the signal for controlling the switch circuits.

According to an embodiment, the device comprises as many first and second pads as first conductive elements.

According to an embodiment, the first pads are input/output pads of the chip.

According to an embodiment, the conductive track forms a ring.

Another embodiment provides a method of testing a device such as previously described, comprising at least two steps, each step comprising: turning off the switch circuits associated with a group of at least two first pads and turning on the other switch circuits; supplying a current to the first conductive element coupled to one of the first pads in the group; and measuring the current flowing at the level of the first conductive elements coupled to the other first pads in the group.

According to an embodiment, each first conductive pad forms part of the group of at least two pads during at least one step.

According to an embodiment, the group comprises two first pads.

According to an embodiment, the first pad in the group receiving the current is always the same first pad.

According to an embodiment, the group comprises first pads different at each step.

According to an embodiment, the current is supplied by one of the second conductive elements and is measured at the level of at least one of the conductive elements.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the various chips that may be comprised in the described devices and their applications are not detailed, the described embodiments being adapted to the different types of chips.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
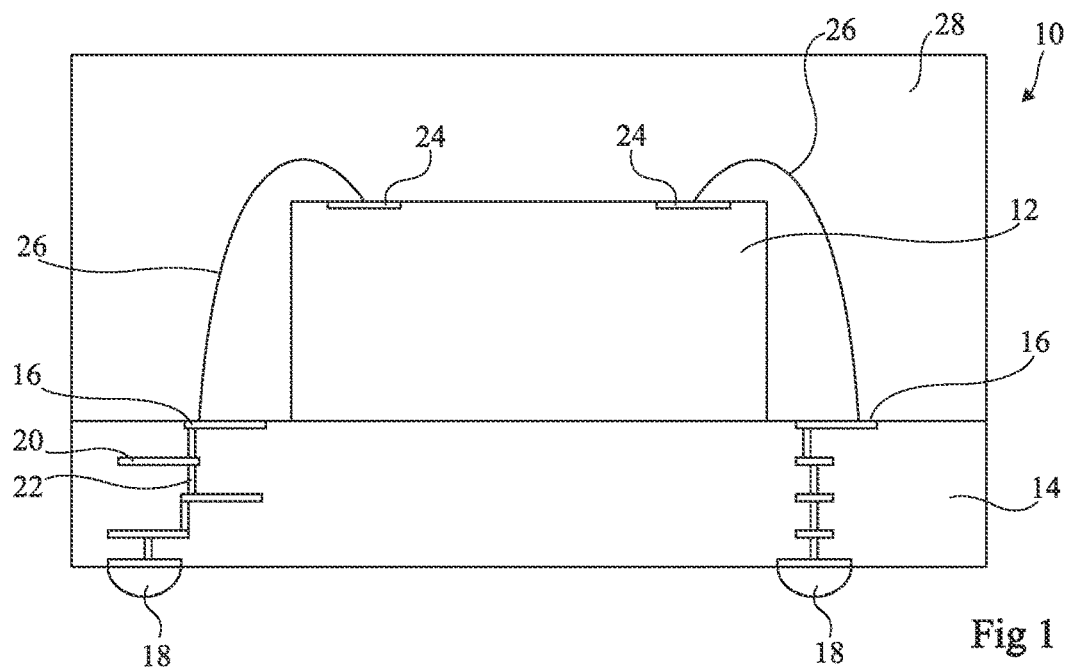
FIG. 1 shows an electronic device to which the embodiments may be applied.

FIG. 1 shows an electronic device 10 to which the embodiments may be applied.

Device 10 comprises an integrated circuit chip 12. Chip 12 comprises, for example, a semiconductor substrate, not shown, inside and on top of which electronic components, not shown, may be formed. Chip 12 comprises, for example, a microcontroller, a memory, a sensor, or another component.

Chip 12 rests on a support 14. Chip 12 is attached to support 14. For example, chip 12 is attached to support 14 by a bonding layer, for example a glue layer, not shown. As a variant, chip 12 may be attached to support 14 by metal solder balls.

Support 14 comprises, at the level of an upper surface of support 14, conductive elements 16. Conductive elements 16 are, for example, conductive pads. Elements 16 are, for example, located in support 14, flush with the upper surface of the support. Elements 16 are thus accessible on the upper surface side of support 14. Elements 16 are electrically coupled to conductive elements 18 located at the level of another surface of the support, for example, a lower surface of support 14.

In the example of FIG. 1, support 14 comprises layers made of an insulating material having electrically-conductive tracks 20 and electrically-conductive vias 22 embedded therein. Elements 16 are electrically coupled to elements 18 by conductive tracks 20 and conductive vias 22.

As a variant, support 14 may be at least partially made of another material, for example, of plastic, of glass, or of a semiconductor material. Elements 16 may be electrically coupled to conductive elements 18 by other conductive elements. For example, conductive elements, not shown, may cross the support. These conductive elements are flush with the upper surface of support 14, forming elements 16, extend in the support and protrude from the support to form elements 18.

Chip 12 comprises conductive pads 24 on an upper surface, that is, the surface most distant from the support, that is, the surface opposite to the surface of chip 12 attached to support 14. Conductive pads 24 are electrically coupled to the chip components.

Pads 24 are electrically coupled to elements 16 by electric wires, or cables 26 (sometimes referred to in the art as bonding wires). Wires 26 thus couple the upper surface of chip 12 to the upper surface of support 14. Thus, the chip may be electrically coupled to an external circuit via pads 24, wires 26, elements 16, tracks 20, vias 22, and elements 18.

Device 10 further comprises a protection layer 28. The protection layer at least partially, preferably entirely, covers the upper surface of the support, that is, the surface having chip 12 attached thereto. In particular, layer 28 covers (i.e., encapsulates) chip 12, preferably entirely. Layer 28 further covers wires 26 and conductive pads 16 and 18. Layer 28 is, for example, made of resin, preferably of resin opaque for the visible range.

It is useful to test the electric connections formed by cables 26. Indeed, cables 26 may be fragile and be damaged during the manufacturing process, in particular during the forming of layer 28. A known test is the generation of images of device 10 by X rays, which enables to observe the cables. It is thus sometimes possible to observe a disconnection of one or a plurality of cables. There is a need, however, for a test enabling to electrically test each connection.

Figure 2:
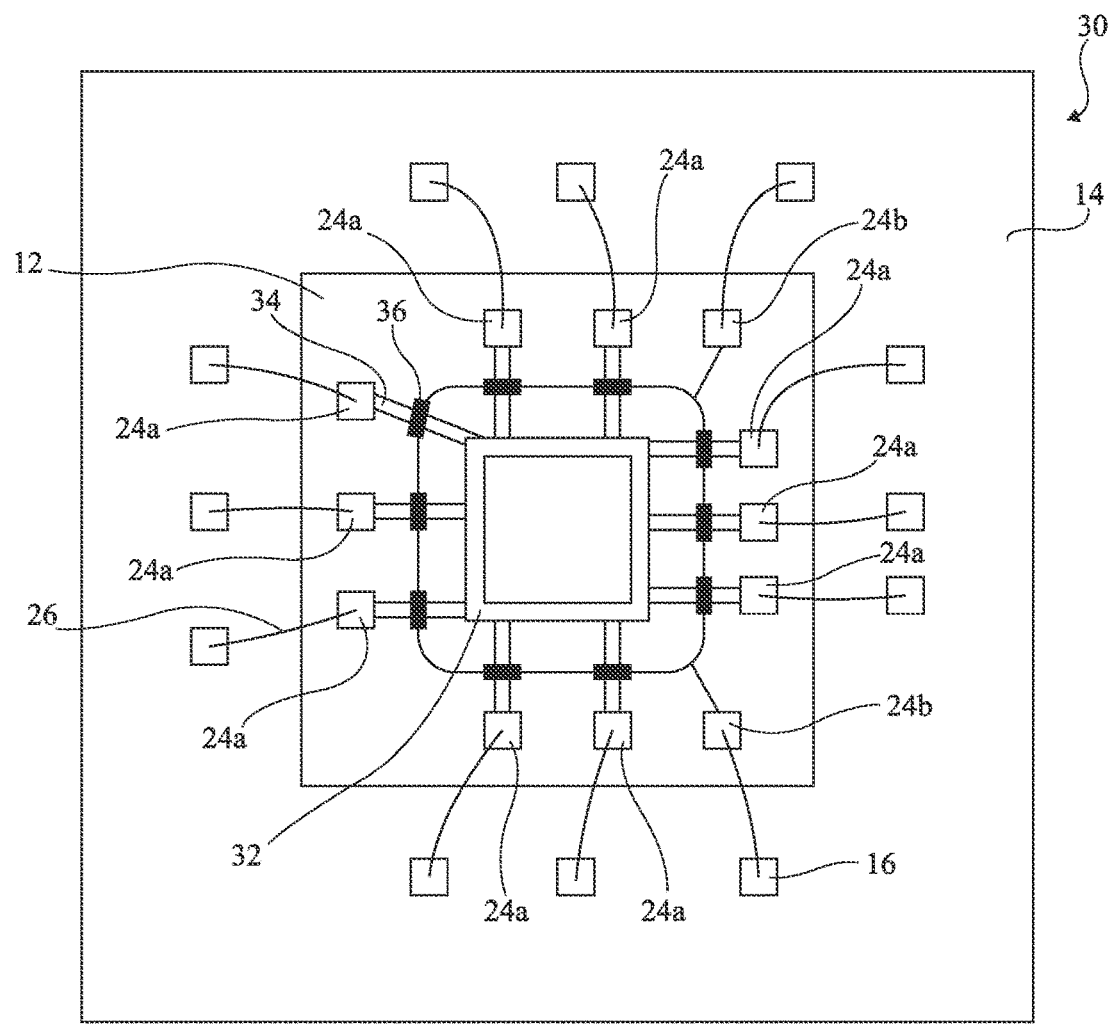
FIG. 2 is a top view of an embodiment of an electronic device comprising wire links.
Figure 3:
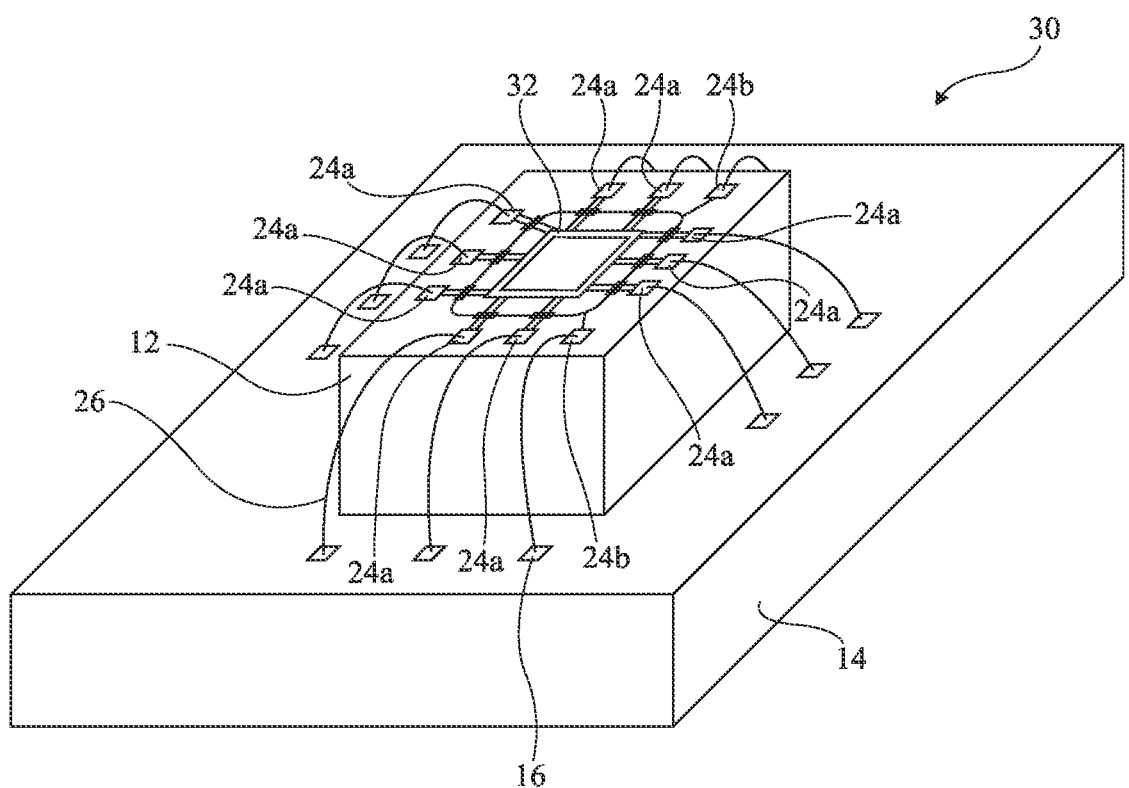
FIG. 3 is a perspective view of the embodiment of FIG. 2.

FIG. 2 is a top view of an embodiment of an electronic device 30 comprising wire links. FIG. 3 is a perspective view of the device 30 of FIG. 2.

Device 30 comprises all the elements of the device 10 of FIG. 1, which will not be described in detail again. However, certain elements of device 10 are not shown in FIGS. 2 and 3 to avoid overloading the drawings. Thus, device 30 comprises layer 28 and conductive elements 18, which are not shown in FIGS. 2 and 3.

The device comprises, in particular, conductive pads 24 located on the upper surface of chip 12. More particularly, the device comprises pads 24a and pads 24b.

Pads 24a are, for example, coupled to elements or components of the chip. Pads 24a, for example, form inputs/outputs of chip 12. Pads 24b are preferably not coupled to elements or components formed in chip 12. Pads 24b are preferably only used for testing the cables 26.

Device 30 comprises, in the example of FIGS. 2 and 3, ten pads 24a. More generally, device 30 may comprise any number of pads 24a, preferably at least two pads 24a. Device 30 preferably comprises two pads 24b.

Device 30 comprises a conductive track 32. Conductive track 32, for example, extends on the upper surface of chip 12. In the example of FIGS. 2 and 3, conductive track 32 forms a continuous ring. The track extends, for example, at the center of the upper surface of the chip 12, pads 24 being located at the periphery of the upper surface of chip 12. Pads 24 thus extend around track 32. Pads 24 are thus located outside of the ring formed by conductive track 32.

As a variant, track 32 may be located at the periphery of the upper surface of the chip, pads 24 then being located at the center of the upper surface of chip 12 with respect to chip 32. Thus, pads 24 would be located inside of the ring.

As a variant, conductive track 32 may be non-continuous. The conductive track may thus comprise an interruption, preferably a single interruption.

Each pad 24 is coupled, by a cable 26, to an element 16. In other words, a cable 26 is connected, for example, by solder, to each pad 24, said cable being further connected, for example, by solder, to an element 16. Device 30 thus preferably comprises at least as many cables 26 and elements 16 as pads 24, preferably as many cables 26 and elements 16 as pads 24.

Each pad 24a is coupled to conductive track 32 by a conductive track 34 switching circuitry which includes a plurality of switch circuits 36. Each switch circuit 36 enables to control forming the electric link between the corresponding pad 24a and conductive track 32. It is thus possible to form a short-circuit between each pad 24a and any of the other pads 24a by controlling the switch circuit(s) associated with this pad 24a.

Pads 24b are configured to receive control signals for the switch circuits. For example, one of pads 24b is configured to be coupled to a source of a reference voltage, for example, the ground. For example, the other pad 24b is coupled to a source of a voltage enabling to control the switch circuits. Pads 24b are thus coupled to all the switch circuits, for example, in series. As a variant, a pad 24b may receive a clock signal and the other pad 24b may receive a control signal.

In the example of FIGS. 2 and 3, the link between the different switches and pads 24b is shown by a single link. In practice, each pad 24b is coupled to all pads 24a, for example in series, independently from the other pad 24b.

In the example of FIGS. 2 and 3, pads 24b are separated by pads 24a. As a variant, pads 24b are located next to one another.

The device may comprise, for example, electrostatic discharge protection circuits for an ESD circuit. For example, an ESD circuit is located at the level of each pad 24a, for example between the switch circuit and pad 24a.

A method of testing cables 26 could thus be implemented. This test is, for example, implemented after the manufacturing of the device, for example after the forming of layer 28, not shown in FIGS. 2 and 3, and of conductive elements 16 and 18. The method comprises at least two steps such as that described hereafter.

During a step of testing part of cables 26, a current is supplied, via an element 18, to a first pad 24a. Said current flows through the first pad 24a towards at least a second pad 24a to reach the element 18 associated with said second pad(s) 24a. The switch circuits associated with the first and second pads are then actuated in a closed state, that is, they are configured to allow the flowing of a current, and the other switch circuits are deactuated in an open state, that is, they are configured to not allow the flowing of a current. The current flowing at the level of elements 18 of the second pad(s) 24a is measured and compared with the supplied current, to determine whether the connection between pads 24a and elements 18, in particular the connections performed by the cables, are functional. Such a step is repeated with other pads until each pad 24a has been tested.

Outside of the test, all switches are preferably deactuated (i.e., to not allow the flowing of current), in order to avoid disturbing the normal operation of the chip.

Figure 4:
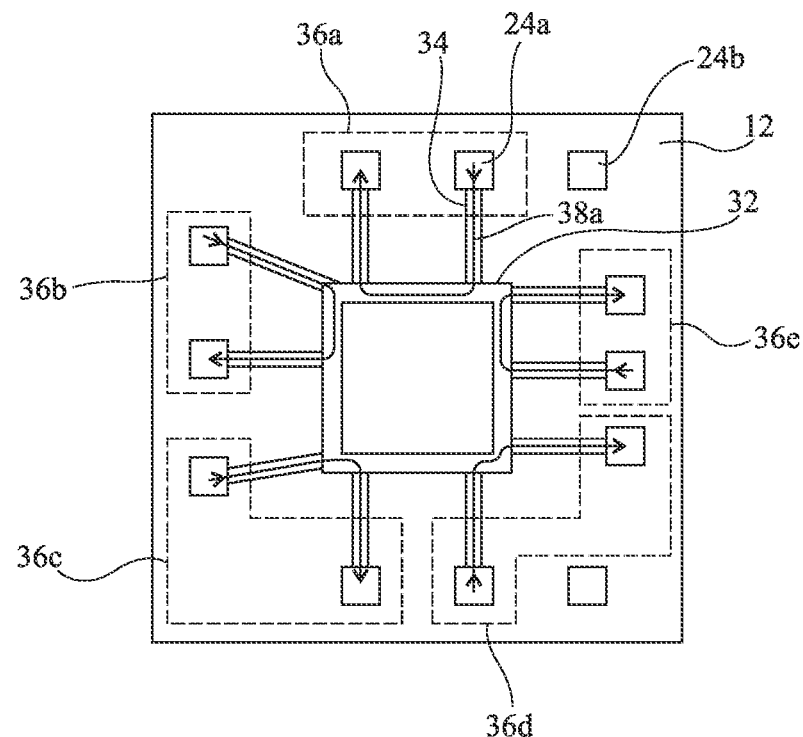
FIG. 4 illustrates an example of test of the wire links.
Figure 5:
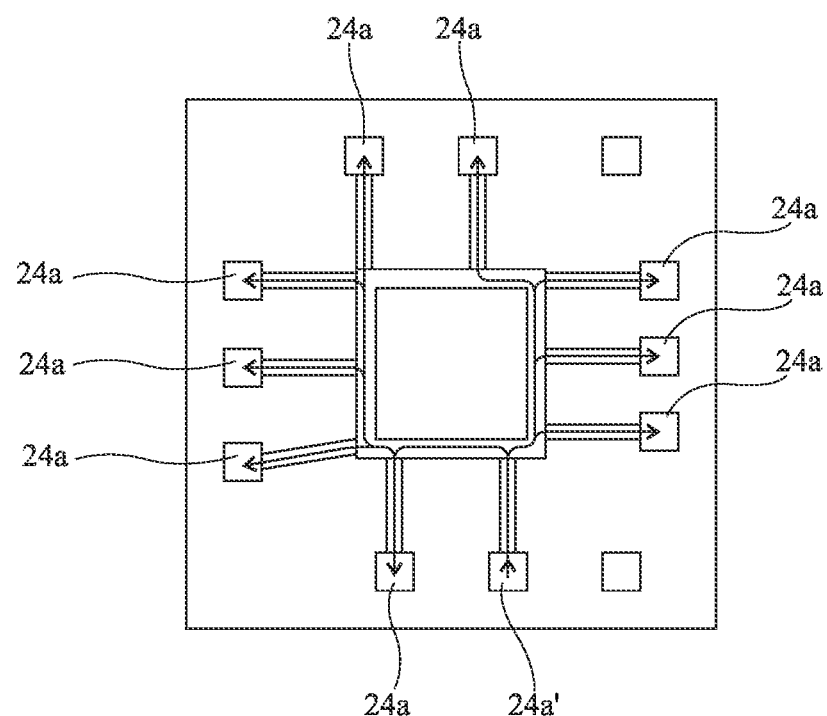
FIG. 5 illustrates another example of test of the wire links.

Examples of implementation of this testing method are described in further detail in relation with FIGS. 4 and 5.

FIG. 4 illustrates an example of wire link testing.

FIG. 4 shows the upper surface of the chip 12 of the embodiment of FIGS. 2 and 3. Pads 24, track 32, and tracks 34 are shown in FIG. 4. Switch circuits 36 and cables 26 are not shown, to simplify the representation.

In this example implementation, each pad 24a is associated with another pad 24a. In other words, pads 24a are associated two by two. FIG. 4 thus comprises five groups 36a, 36b, 36c, 36d, 36e of two pads 24a. In the example of FIG. 4, the pads 24a of a same group are neighboring pads. More generally, pads 24a may be associated with any other pad 24a. Preferably, each pad 24a is in a single group 36.

The testing of the wire links, that is, of cables 26, for example comprises as many steps as groups 36. During each step, the switches associated with the pads 24a of a group 36 are actuated to the closed state to allow the flowing of a current, and the switches associated with the other pads 24a are deactuated to the open state and do not allow the flowing of a current. A current is then supplied to a first pad 24a of said group, via the elements 16 and 18 associated with this first pad 24a. The current on the element 18 associated with the second pad 24a in the group is then measured. It is then possible to determine whether the current received at the level of the element 18 associated with second pad 24a is sufficiently close to the supplied current for the wire connections to be considered as functional. For example, the wire links are considered as functional if the measured current is substantially equal to the supplied current.

The current measurement and supply is performed from elements 18 which, since they are not covered with layer 28, are accessible after the manufacturing of the device.

Thus, during an example of first step of the test, the switch circuits associated with group 36a are actuated in the closed state and the switch circuits associated with the other groups 36b, 36c, 36d, and 36e are deactuated in the open state. A current, represented by a path with directional arrows 38a, is supplied at the level of the conductive element 18 associated with a first pad 24a of group 36a. The current flows from the first pad 24a to the second pad 24a of group 36a via track 32, to reach the element 18 associated with the second pad 24a. The current is measured at the level of the element 18 associated with the second pad 24a. The current is then compared with the supplied current. A similar step is carried out for each group 36.

If the measured current is too low with respect to the supplied current, for example, lower than a desired threshold, for example, substantially zero, this means that at least one of the cables is damaged.

The control of switch circuits 36 is performed via pads 24b. For example, a control voltage is supplied between the two pads 24b.

Preferably, the components of chip 12 other than switch circuits 36 are not in operation, for example, are not powered.

According to a variant of the example of FIG. 4, each group 36 may comprise more than two pads 24a.

FIG. 5 illustrates another example of wire link testing.

This example of test differs from the test of FIG. 4 in that the current is supplied on the same element 18, associated with a same pad 24a' during all the steps of the test. Thus, there are as many steps as pads 24a other than pad 24a'.

Thus, each step of this example of test is similar to the step described in relation with FIG. 4, the first pad being the pad 24a' and the second pad being one of the other pads 24a. The step is thus repeated as many times as necessary so that each pad 24a is tested.

According to a variant of the example of FIG. 5, the switches of a plurality of pads 24a other than pad 24a' are actuated in the closed state (that is they are configured to allow the flow of current). The current is supplied to pad 24a' and the measurements are made on the other pads at the same time. The number of pads 24a and the value of the supplied current enables to determine the threshold value enabling to determine whether the wire links are functional.

Another advantage of the described embodiments is that these tests also enable to test the cables 26 corresponding to pads 24b. Indeed, if the cables associated with pads 24b are damaged, the signal for controlling the switch circuits is not supplied and the switch circuits remain all actuated or all deactuated, which causes measurements different from the expected measurements, and enables to detect a problem.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

The invention claimed is:

1. A device, comprising:
   a support including first conductive elements located on a first surface of the support;
   an integrated circuit chip attached to the support, the integrated circuit chip including first conductive pads;
   conductive wires coupling the first conductive pads to the first conductive elements;
   a conductive track located on the integrated circuit chip; and
   switching circuitry including a plurality of switch circuits, each switch circuit configured to selectively connect one of the first conductive pads to the conductive track.

2. The device according to claim 1, wherein the integrated circuit chip is covered with a protection layer that also covers the first conductive elements and the conductive wires.

3. The device according to claim 1, further comprising second conductive elements located on a second surface of the support and electrically connected through the support to the first conductive elements.

4. The device according to claim 1, further comprising one or more second conductive pads located on the integrated circuit chip, wherein each second conductive pad is coupled to one of the first conductive elements by one of the conductive wires.

5. The device according to claim 4, wherein the one or more second conductive pads are electrically connected to the switching circuitry and are further configured to supply signaling for controlling actuation and deactuation of each switch circuit of the plurality of switch circuits.

6. The device according to claim 5, wherein said one or more second conductive pads comprise a first one of the second conductive pads configured to receive a reference voltage and a second one of the second conductive pads configured to receive a control voltage for controlling actuation and deactuation of each switch circuit of the plurality of switch circuits.

7. The device according to claim 5, wherein said one or more second conductive pads comprise a first one of the second conductive pads configured to receive a clock signal and a second one of the second conductive pads configured to receive a control voltage for controlling actuation and deactuation of each switch circuit.

8. The device according to claim 4, wherein there are as many first and second conductive pads as there are first conductive elements.

9. The device according to claim 1, wherein the first conductive pads are input/output pads of the integrated circuit chip.

10. The device according to claim 1, wherein the conductive track forms a ring.

11. A method of testing a device which includes: an integrated circuit chip attached to a support; first conductive elements located on a first surface of the support; first conductive pads located on the integrated circuit chip, the first conductive pads being coupled to the first conductive elements by conductive wires; a conductive track located on the integrated circuit chip; and switching circuitry including switch circuits configured to selectively connect each first conductive pad to the conductive track, the method comprising:
  actuating switch circuits associated with a group which includes at least two first conductive pads and deactuating all other switch circuits;
  supplying a current to the first conductive element coupled to one of the first conductive pads in the group; and
  measuring current flowing through the first conductive elements coupled to at least one of the other first conductive pads in the group.

12. The method of claim 11, further comprising repeating with a different group.

13. The method of claim 12, wherein the at least two first conductive pads of each group are different for each repeat.

14. The method of claim 11, further comprising repeating such that each first conductive pad forms part of at least one of the groups.

15. The method according to claim 14, wherein a same one of the first conductive pads receives the current for all groups.

16. The method according to claim 14, wherein each group includes different ones of the first conductive pads.

17. The method according to claim 11, wherein the group comprises two first conductive pads.

18. The method according to claim 11, wherein the device further includes second conductive elements located on a second surface of the support and electrically connected through the support to the first conductive elements, and wherein supplying the current and measuring current are performed with respect to at least one of the second conductive elements.

* * * * *